(12) United States Patent
Narita

(10) Patent No.: US 11,161,331 B2
(45) Date of Patent: Nov. 2, 2021

(54) PLATED LAYER FORMING COMPOSITION, FILM HAVING PLATED-LAYER PRECURSOR LAYER, FILM HAVING PATTERNED PLATED LAYER, ELECTROCONDUCTIVE FILM, AND TOUCH PANEL

(71) Applicant: FUJIFILM Corporation, Tokyo (JP)

(72) Inventor: Takeshi Narita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 284 days.

(21) Appl. No.: 16/122,651

(22) Filed: Sep. 5, 2018

(65) Prior Publication Data

US 2019/0001645 A1 Jan. 3, 2019

Related U.S. Application Data

(63) Continuation of application No. PCT/JP2017/008974, filed on Mar. 7, 2017.

(30) Foreign Application Priority Data

Mar. 11, 2016 (JP) .............................. JP2016-048740

(51) Int. Cl.
*B32B 27/30* (2006.01)
*G02F 1/1333* (2006.01)
(Continued)

(52) U.S. Cl.
CPC ............ *B32B 27/308* (2013.01); *B32B 27/30* (2013.01); *C08F 2/50* (2013.01); *C08F 265/02* (2013.01);
(Continued)

(58) Field of Classification Search
CPC .................................................. C08F 222/385
See application file for complete search history.

(56) References Cited

U.S. PATENT DOCUMENTS

| 2010/0080893 A1 | 4/2010 | Inoue et al. |
| 2013/0050331 A1 | 2/2013 | Kaeriyama et al. |
| (Continued) | | |

FOREIGN PATENT DOCUMENTS

| JP | 2007-026426 A | 2/2007 |
| JP | 2009-218509 A | 9/2009 |
| (Continued) | | |

OTHER PUBLICATIONS

International Search Report issued in PCT/JP2017/008974; dated May 16, 2017.
(Continued)

*Primary Examiner* — Ian A Rummel
(74) *Attorney, Agent, or Firm* — Studebaker & Bracket PC

(57) ABSTRACT

An object of the present invention is to provide a plated layer forming composition which is capable of forming a plated layer having excellent alkali resistance and is capable of forming a metal layer on the plated layer even in the case of forming the plated layer by exposure with a low exposure amount; a film having a plated-layer precursor layer; a film having a patterned plated layer; an electroconductive film; and a touch panel. The plated layer forming composition of the present invention includes a polymer having a group capable of interacting with a plating catalyst or a precursor thereof, and a polyfunctional monomer having three or more acrylamide groups or methacrylamide groups.

7 Claims, 2 Drawing Sheets

(51) Int. Cl.
    *C08L 33/26* (2006.01)
    *C23C 18/30* (2006.01)
    *C23C 18/20* (2006.01)
    *C08F 2/50* (2006.01)
    *C09D 4/06* (2006.01)
    *C23C 18/16* (2006.01)
    *C08F 265/02* (2006.01)
    *H05K 3/18* (2006.01)
    *C23C 18/38* (2006.01)
    *C08F 222/38* (2006.01)

(52) U.S. Cl.
    CPC ................ *C08L 33/26* (2013.01); *C09D 4/06* (2013.01); *C23C 18/1608* (2013.01); *C23C 18/2086* (2013.01); *C23C 18/30* (2013.01); *H05K 3/185* (2013.01); *H05K 999/99* (2013.01); *B32B 2457/208* (2013.01); *C08F 222/385* (2013.01); *C08L 2203/16* (2013.01); *C23C 18/38* (2013.01); *G02F 1/13338* (2013.01); *G06F 2203/04103* (2013.01)

(56) References Cited

U.S. PATENT DOCUMENTS

| | | |
|---|---|---|
| 2013/0050365 A1 | 2/2013 | Irita |
| 2017/0067165 A1 | 3/2017 | Tsukamoto |

FOREIGN PATENT DOCUMENTS

| | | |
|---|---|---|
| JP | 2010-084196 A | 4/2010 |
| JP | 2013-043945 A | 3/2013 |
| JP | 2013-043946 A | 3/2013 |
| JP | 5486536 B2 | 5/2014 |
| WO | 2015/190484 A1 | 12/2015 |

OTHER PUBLICATIONS

International Preliminary Report on Patentability and Written Opinion issued in PCT/JP2017/008974; dated Sep. 11, 2018.

An Office Action mailed by the Japanese Patent Office dated Aug. 20, 2019, which corresponds to Japanese Patent Application No. 2018-504505 and is related to U.S. Appl. No. 16/122,651; with English language translation.

PLATED LAYER FORMING COMPOSITION, FILM HAVING PLATED-LAYER PRECURSOR LAYER, FILM HAVING PATTERNED PLATED LAYER, ELECTROCONDUCTIVE FILM, AND TOUCH PANEL

CROSS-REFERENCE TO RELATED APPLICATIONS

This application is a Continuation of PCT International Application No. PCT/JP2017/008974 filed on Mar. 7, 2017, which claims priority under 35 U.S.C. § 119(a) to Japanese Patent Application No. 2016-048740 filed on Mar. 11, 2016. The above application is hereby expressly incorporated by reference, in its entirety, into the present application.

BACKGROUND OF THE INVENTION

1. Field of the Invention

The present invention relates to a plated layer forming composition, a film having a plated-layer precursor layer, a film having a patterned plated layer, an electroconductive film, and a touch panel.

2. Description of the Related Art

An electroconductive film having a conductive film (electroconductive thin wire) disposed on a substrate has been used for various purposes. Particularly, in recent years, along with an increase in the rate at which a touch panel has been mounted on mobile phones or portable game devices, a demand for an electroconductive film for an electrostatic capacitance touch panel sensor capable of carrying out multi-point detection has been rapidly increasing.

For the formation of such a conductive film, for example, a method using a patterned plated layer has been proposed.

For example, JP2009-218509A discloses a "method for forming a conductive film including (a) a step of forming a resin layer made of a thermosetting resin composition containing a radical polymerizable compound and a thermosetting resin and having a gelling time at 70° C. of 60 minutes or shorter (resin layer A), on an organic resin substrate, (b) a step of forming a resin layer containing a resin having a functional group capable of interacting with an electroless plating catalyst or a precursor thereof, a radical generator, and a radical polymerizable compound and capable of adsorbing an electroless plating catalyst or a precursor thereof (resin layer B), (c) a step of applying an electroless plating catalyst or a precursor thereof to the layer capable of adsorbing an electroless plating catalyst or a precursor thereof (resin layer B), and (d) a step of carrying out electroless plating to form an electroless plating film" as a method for forming a conductive film.

As a resin composition for forming a resin layer B as a patterned plated layer which is an underlayer of a plating film, in Example 10 of JP2009-218509A, an acrylic resin composition containing polyacrylic acid and N,N'-methylene bis(acrylamide) which is a difunctional monomer is disclosed. In order to form the patterned plated layer, the layer of the acrylic resin composition is subjected to an exposure treatment.

SUMMARY OF THE INVENTION

Meanwhile, in recent years, there has been a demand for improvement in productivity of a conductive film, and it is desired that, in the case where the exposure treatment is carried out as in JP2009-218509A, a desired conductive film is formed with a low exposure amount.

The present inventors have studied an acrylic resin composition (a plated layer forming composition) containing a difunctional monomer as described in Example 10 of JP2009-218509A. Specifically, in the case where the exposure amount is small at the time of exposing the plated layer forming composition, the present inventors have found that, even in the case where the patterned plated layer formed by exposing and developing the plated layer forming composition is subjected to a plating treatment, plating may not be deposited in some cases (in other words, a metal layer may not be formed in some cases).

Further, in the plating treatment, a highly alkaline plating liquid such as a copper plating liquid may be used in some cases. In the case where the resistance of the plated layer to an alkali (hereinafter, also referred to as "alkali resistance") is inferior, the plated layer is peeled off from the substrate and therefore a metal layer cannot be formed on the substrate in the case where a highly alkaline plating liquid is applied to the plated layer. Therefore, it is also required that the plated layer forming composition is capable of forming a plated layer having excellent alkali resistance.

Accordingly, an object of the present invention is to provide a plated layer forming composition which is capable of forming a plated layer having excellent alkali resistance and is capable of forming a metal layer on the plated layer even in the case of forming the plated layer by exposure with a low exposure amount.

Another object of the present invention is to provide a film having a plated-layer precursor layer formed using the plated layer forming composition.

Still another object of the present invention is to provide a film having a patterned plated layer formed using the film having a plated-layer precursor layer, as well as an electroconductive film and a touch panel using the same.

As a result of extensive studies to achieve the foregoing objects, the present inventors have found that the foregoing objects can be achieved in the case where a plated layer forming composition contains a polymer having a group capable of interacting with a plating catalyst or a precursor thereof and a polyfunctional monomer having three or more acrylamide groups or methacrylamide groups. The present invention has been completed based on these findings.

That is, the present inventors have found that the foregoing objects can be achieved by the following configurations.

(1) A plated layer forming composition, comprising:

a polymer having a group capable of interacting with a plating catalyst or a precursor thereof, and a polyfunctional monomer having three or more acrylamide groups or methacrylamide groups.

(2) The plated layer forming composition according to (1), in which the group capable of interacting with a plating catalyst or a precursor thereof is a carboxy group.

(3) The plated layer forming composition according to (1) or (2), further comprising:

a surfactant.

(4) The plated layer forming composition according to any one of (1) to (3), in which the content of the polyfunctional monomer relative to the polymer is more than 1 in terms of mass ratio.

(5) A film having a plated-layer precursor layer, comprising:
a substrate; and
a plated-layer precursor layer disposed on the substrate and formed of the plated layer forming composition according to any one of (1) to (4).

(6) The film having a plated-layer precursor layer according to (5), further comprising:
an interlayer between the substrate and the plated-layer precursor layer.

(7) A film having a patterned plated layer, which is obtained by curing the plated-layer precursor layer in the film having a plated-layer precursor layer according to (5) or (6) in a patternwise manner by exposure, the film comprising:
a substrate; and
a patterned plated layer.

(8) An electroconductive film obtained by laminating a metal layer on the patterned plated layer of the film having a patterned plated layer according to (7).

(9) A touch panel comprising:
the electroconductive film according to (8).

According to the present invention, it is possible to provide a plated layer forming composition which is capable of forming a plated layer having excellent alkali resistance and is capable of forming a metal layer on the plated layer even in the case of forming the plated layer by exposure with a low exposure amount.

Further, according to the present invention, it is possible to provide a film having a plated-layer precursor layer formed using the plated layer forming composition.

Further, according to the present invention, it is possible to provide a film having a patterned plated layer formed using the film having a plated-layer precursor layer, as well as an electroconductive film and a touch panel using the same.

DESCRIPTION OF THE PREFERRED EMBODIMENTS

Figure 1:
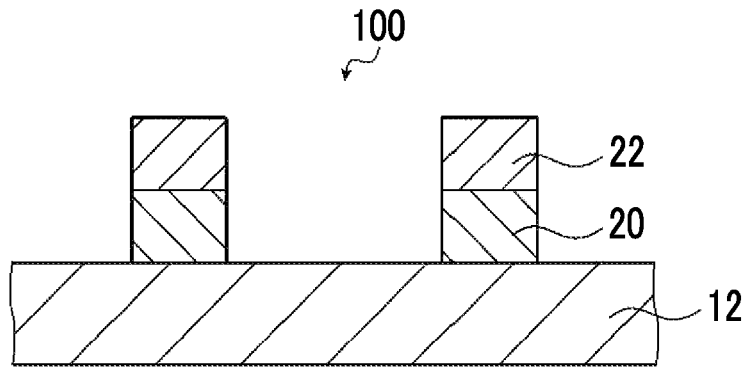
FIG. 1 is a cross-sectional view schematically showing an example of an embodiment of a film having an electroconductive film of the present invention.

Hereinafter, the present invention will be described in detail.

Descriptions of the constituent features described below are sometimes made based on representative embodiments of the present invention, but the present invention is not limited to such embodiments.

Further, in the present specification, the numerical range expressed by using "to" means a range including numerical values described before and after "to" as a lower limit value and an upper limit value, respectively.

Further, in the present specification, the term "actinic rays" or "radiation" includes, for example, a bright line spectrum of a mercury lamp, far ultraviolet rays typified by an excimer laser, extreme ultraviolet rays (EUV light), X-rays, and electron beams (EB). In the present invention, the light means actinic rays or radiation.

Further, in the present specification, unless otherwise specified, the term "exposure" includes not only exposure by a mercury lamp, far ultraviolet rays typified by an excimer laser, extreme ultraviolet rays, X-rays and EUV light, but also lithography by electron beams, and particle beams such as ion beams.

[Plated Layer Forming Composition]

The plated layer forming composition of the present invention includes
a polymer having a group capable of interacting with a plating catalyst or a precursor thereof, and
a polyfunctional monomer having three or more acrylamide groups or methacrylamide groups.

By adopting the above-mentioned configuration, the plated layer forming composition of the present invention exhibits excellent alkali resistance, and is therefore capable of forming a metal layer on a plated layer even in the case of forming the plated layer by exposure with a low exposure amount.

Although the reason that such an effect is achieved is not clear in detail, it is presumed as follows.

The feature of the plated layer forming composition of the present invention is that it contains a polyfunctional monomer having three or more acrylamide groups or methacrylamide groups.

The polyfunctional monomer having three or more acrylamide groups or methacrylamide groups (hereinafter, also referred to as "(meth)acrylamide groups") is crosslinked and cured by exposure to form a dense network, and a polymer having a group capable of interacting with a plating catalyst or a precursor thereof is entangled and retained in the network. Therefore, the formed plated layer functions as an underlayer for adsorbing a plating catalyst or a precursor thereof.

Also, the plated layer formed by this polyfunctional monomer exhibits excellent alkali resistance. For this reason, it is difficult for the plated layer to be peeled from the substrate during the plating treatment with a highly alkaline plating liquid. As a result, a metal layer can be formed on the plated layer.

Further, as compared with a film formed by curing a difunctional monomer of (meth)acrylamide groups by exposure, the film formed by curing a polyfunctional monomer having three or more (meth)acrylamide groups by exposure hardly flows during the development even after exposure with a lower exposure amount. That is, in the case where a plated layer forming composition containing a polyfunctional monomer having three or more (meth)acrylamide groups is subjected to exposure with a lower exposure amount, it is considered that the formed film hardly flows during the development and as a result, a polymer having a group capable of interacting with a plating catalyst or a precursor thereof can be well retained in the network. Thus, even in the case where the plated layer is formed by exposure with a low exposure amount, the metal layer can be formed on the plated layer.

Hereinafter, first, each component of the plated layer forming composition of the present invention will be described.

<Polymer Having Group Capable of Interacting with Plating Catalyst or Precursor Thereof>

The plated layer forming composition contains a polymer having a group capable of interacting with a plating catalyst or a precursor thereof.

The polymer having a group capable of interacting with a plating catalyst or a precursor thereof may have a polymerizable functional group in the structure thereof, but from the viewpoint of making the effect of the present invention superior, it is preferred that the polymer has no polymerizable functional group.

The phrase "has no polymerizable functional group" means that the polymer has substantially no polymerizable functional group, and the content of the polymerizable functional group is preferably 0.1% by mass or less and more preferably 0.01% by mass or less with respect to the total mass of the polymer. The lower limit of the content of the polymerizable functional group is not particularly limited, but it is 0% by mass.

The polymerizable functional group is a functional group capable of forming a chemical bond through the application of energy, and examples thereof include a radically polymerizable group and a cationic polymerizable functional group. Examples of the polymerizable functional group include unsaturated carboxylic ester groups such as an acrylic ester group (acryloyloxy group), methacrylic ester group (methacryloyloxy group), an itaconic ester group, a crotonic ester group, an isocrotonic ester group, and a maleic ester group; additionally a styryl group, a vinyl group, an acrylamide group, and an methacrylamide group.

The group capable of interacting with a plating catalyst or a precursor thereof (hereinafter, also referred to as an "interactive group") is intended to refer to a functional group capable of interacting with a plating catalyst or a precursor thereof (for example, a metal or a metal ion) which is applied to a plated layer. As a specific interactive group, for example, a functional group capable of forming an electrostatic interaction with a plating catalyst or a precursor thereof, or a nitrogen-, sulfur- or oxygen-containing functional group capable of forming a coordination with a plating catalyst or a precursor thereof may be used.

More specific examples of the interactive group include nitrogen-containing functional groups such as an amino group, an amide group, an imido group, a urea group, a tertiary amino group, an ammonium group, an amidino group, a triazine ring, a triazole ring, a benzotriazole group, an imidazole group, a benzimidazole group, a quinoline group, a pyridine group, a pyrimidine group, a pyrazine group, a nazoline group, a quinoxaline group, a purine group, a triazine group, a piperidine group, a piperazine group, a pyrrolidine group, a pyrazole group, an aniline group, a group containing an alkylamine structure, a group containing an isocyanuric structure, a nitro group, a nitroso group, an azo group, a diazo group, an azide group, a cyano group, and a cyanate group; oxygen-containing functional groups such as an ether group, a hydroxy group, a phenolic hydroxy group, a carboxy group, a carbonate group, a carbonyl group, an ester group, a group containing an N-oxide structure, a group containing an S-oxide structure, and a group containing an N-hydroxy structure; sulfur-containing functional groups such as a thiophene group, a thiol group, a thiourea group, a thiocyanurate group, a benzothiazole group, a mercaptotriazine group, a thioether group, a thioxy group, a sulfoxide group, a sulfone group, a sulfite group, a group containing a sulfoximine structure, a group containing a sulfoxinium salt structure, a sulfonate group, and a group containing a sulfonic ester structure; phosphorus-containing functional groups such as a phosphate group, a phosphoramide group, a phosphine group, and a group containing a phosphoric ester structure; and groups containing halogen atoms such as a chlorine atom and a bromine atom. In a functional group that may have a salt structure, a salt thereof may also be used.

Among them, an ionic polar group such as a carboxy group, a sulfonate group, a phosphate group, or a boronate group, an ether group, or a cyano group is preferable from the viewpoint of high polarity and high adsorptive capacity to a plating catalyst or a precursor thereof. From the viewpoint that the ability to adsorb onto a plating catalyst or a precursor thereof and concurrently developability can be imparted, a carboxy group or a sulfonate group is more preferable, and from the viewpoint that it is moderately acidic (does not decompose other functional groups), a carboxy group is still more preferable.

The polymer may contain two or more types of interactive groups.

The polymer having a group capable of interacting with a plating catalyst or a precursor thereof is not particularly limited, but it may be, for example, a polymer having a repeating unit (A) represented by Formula (2).

Formula (2)

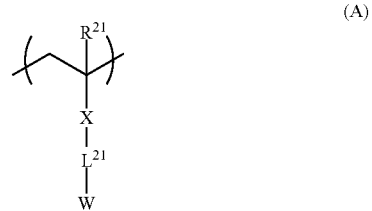

In Formula (2), $R^{21}$ represents a hydrogen atom or a substituted or unsubstituted alkyl group (for example, a methyl group, an ethyl group, a propyl group, or a butyl group). The type of the substituent is not particularly limited, and examples thereof include a methoxy group, a chlorine atom, a bromine atom, and a fluorine atom.

$R^{21}$ is preferably a hydrogen atom, a methyl group, or a methyl group substituted with a bromine atom.

In Formula (2), X represents a single bond or a substituted or unsubstituted divalent organic group. The type of the substituent is not particularly limited, and examples thereof include a methoxy group, a chlorine atom, a bromine atom, and a fluorine atom.

Examples of the divalent organic group include a substituted or unsubstituted divalent aliphatic hydrocarbon group (preferably an alkylene group having 1 to 8 carbon atoms, such as a methylene group, an ethylene group, or a propylene group), a substituted or unsubstituted divalent aromatic hydrocarbon group (preferably having 6 to 12 carbon atoms, such as a phenylene group), —O—, —S—, —SO$_2$—, —N(R)— (R: an alkyl group (preferably having 1 to 8 carbon atoms)), —CO—, —NH—, —COO—, —CONH—, and a group formed by combining these groups (for example, an alkyleneoxy group, an alkyleneoxycarbonyl group, or an alkylenecarbonyloxy group).

X is preferably a single bond, an ester group (—COO—), an amide group (—CONH—), an ether group (—O—), or a substituted or unsubstituted divalent aromatic hydrocarbon group and more preferably a single bond, an ester group (—COO—), or an amide group (—CONH—), from the viewpoint of easy synthesis of a polymer and superior adhesiveness of a metal layer.

In Formula (2), $L^{21}$ represents a single bond or a substituted or unsubstituted divalent organic group. The substituted or unsubstituted divalent organic group has the same definition as the substituted or unsubstituted divalent organic group represented by X.

$L^{21}$ is preferably a single bond, a substituted or unsubstituted divalent aliphatic hydrocarbon group, a substituted or unsubstituted divalent aromatic hydrocarbon group, or a group formed by combining these groups, from the viewpoint of superior adhesiveness of a metal layer. Among these, $L^{21}$ is more preferably a single bond or a substituted or unsubstituted divalent organic group having a total of 1 to 15 carbon atoms. The divalent organic group is preferably unsubstituted. Here, the total number of carbon atoms refers to a total number of carbon atoms contained in the substituted or unsubstituted divalent organic group represented by $L^{21}$.

In Formula (2), W represents an interactive group. The interactive group is as defined above.

Among the foregoing, poly(meth)acrylic acid is preferable as the polymer from the viewpoint of ease of synthesis. In the present invention, the term (meth)acrylic acid is a concept including both acrylic acid and methacrylic acid.

From the viewpoint of adsorptivity to a plating catalyst or a precursor thereof, the content of the interactive group unit (repeating unit (A)) is preferably 5 to 100 mol % and more preferably 10 to 100 mol %, with respect to the total repeating units in the polymer.

Further, the polymer may contain a repeating unit other than the above-mentioned repeating unit (A), and examples thereof include repeating units derived from known monomers (for example, a styrene monomer, an olefin monomer, and an acrylic monomer) not containing an interactive group.

The weight-average molecular weight of the polymer having a group capable of interacting with a plating catalyst or a precursor thereof is not particularly limited, but it is preferably 1,000 to 700,000, more preferably 1,000 to 500,000, and still more preferably 2,000 to 200,000, from the viewpoint that handleability such as solubility is superior. In particular, it is preferably 20,000 or more from the viewpoint of polymerization sensitivity.

These polymers can be produced by known methods.

The weight-average molecular weight of the polymer having a group capable of interacting with a plating catalyst or a precursor thereof can be confirmed using gel permeation chromatography (GPC). That is, in order to determine the weight-average molecular weight of the polymer having a group capable of interacting with a plating catalyst or a precursor thereof by GPC, calculation may be made based on the calibration curve of the relationship between retention time and molecular weight, which is obtained by measuring several types of polymers (for example, polystyrenes) having known molecular weights different from each other under the same conditions.

More specifically, as a GPC measurement method, the object is dissolved in tetrahydrofuran (THF) and then the weight-average molecular weight can be calculated in terms of polystyrene using a high-speed GPC apparatus (for example, HLC-8220 GPC (manufactured by Tosoh Corporation)). The conditions for GPC measurement are as follows.

Column: TSK-GEL SuperH manufactured by Tosoh Corporation
Column temperature: 40° C.
Flow rate: 1 mL/min
Eluent: THF The content of the polymer having a group capable of interacting with a plating catalyst or a precursor thereof in the plated layer forming composition is not particularly limited, but from the viewpoint that it is possible to form a metal layer on a plated layer even in the case of forming the plated layer by exposure with a lower exposure amount, it is preferably 20% by mass or more and more preferably 25% by mass or more with respect to 100% by mass of the total solid content in the composition. The upper limit thereof is not particularly limited, but it is preferably 70% by mass or less, more preferably 60% by mass or less, and still more preferably 45% by mass or less.

<Polyfunctional Monomer Having Three or More Acrylamide Groups or Methacrylamide Groups>

The plated layer forming composition of the present invention contains a polyfunctional monomer having three or more (meth)acrylamide groups.

The polyfunctional monomer having three or more (meth)acrylamide groups (hereinafter, also referred to as "polyfunctional monomer") may have three or more (meth)acrylamide groups, but the number of (meth)acrylamide groups is preferably 3 to 8 and more preferably 4 to 6, from the viewpoint that it is possible to form a metal layer on a plated layer even in the case of forming the plated layer by exposure with a lower exposure amount.

The molecular weight of the polyfunctional monomer is not particularly limited, but it is preferably 200 to 1,500 and more preferably 250 to 1,000, from the viewpoint of further improving the reactivity and further suppressing curing shrinkage. In other words, by setting the molecular weight of the polyfunctional monomer to 200 or more, occurrence of curing shrinkage can be further suppressed. On the other hand, by setting the molecular weight of the polyfunctional monomer to 1,500 or less, it is possible to further suppress the decrease in reactivity due to the decrease in diffusion rate.

In addition, the polyfunctional monomer may contain the above-mentioned interactive group.

One suitable aspect of the polyfunctional monomer may be, for example, a compound represented by Formula (X), from the viewpoint that it is possible to form a metal layer on a plated layer even in the case of forming the plated layer by exposure with a lower exposure amount.

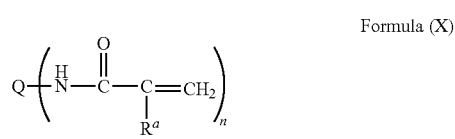

Formula (X)

In Formula (X), Q represents an n-valent linking group, and $R^a$ represents a hydrogen atom or a methyl group. n represents an integer of 3 or more.

$R^a$ represents a hydrogen atom or a methyl group, preferably a hydrogen atom.

The valence n of Q is 3 or more, preferably 3 to 6.

Examples of the n-valent linking group represented by Q include a group represented by Formula (1A), a group represented by Formula (1B),

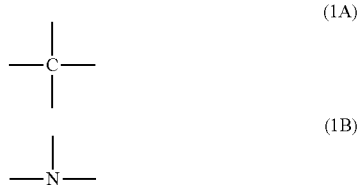

an aromatic group, a heterocyclic group, and a group formed by combining one or more selected from these groups with one or more selected from —NH—, —NR (where R represents an alkyl group)-, —O—, —S—, a carbonyl group, an alkylene group, an alkenylene group, an alkynylene group, and a cycloalkylene group.

With respect to the compound represented by Formula (X), reference may be appropriately made to the description of paragraphs [0019] to [0034] of JP2013-43946A and paragraphs [0070] to [0080] of JP2013-43945A.

From the viewpoint that it is possible to form a metal layer on a plated layer even in the case of forming the plated layer by exposure with a lower exposure amount, a suitable aspect of the compound represented by Formula (X) may be, for example, a compound represented by Formula (Y).

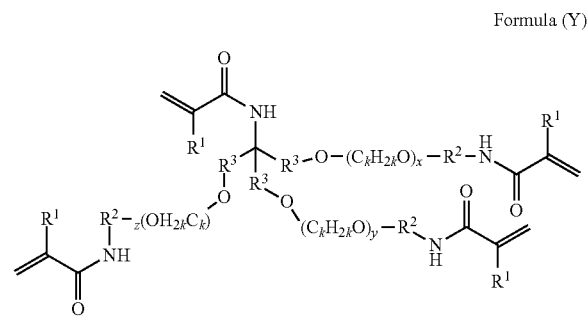

Formula (Y)

In Formula (Y), $R^1$'s each independently represent a hydrogen atom or a methyl group. $R^2$'s each independently represent a linear or branched alkylene group having 2 to 4 carbon atoms, provided that $R^2$ does not have a structure in which oxygen atoms and nitrogen atoms bonded to both ends of $R^2$ are bonded to the same carbon atom of $R^2$. $R^3$'s each independently represent a divalent linking group. k represents 2 or 3. x, y, and z each independently represent an integer of 0 to 6, and x+y+z satisfies 0 to 18.

$R^2$ represents a linear or branched alkylene group having 2 to 4 carbon atoms. The plurality of $R^2$'s may be the same as or different from each other. $R^2$ is preferably an alkylene group having 3 or 4 carbon atoms, more preferably an alkylene group having 3 carbon atoms, and still more preferably a linear alkylene group having 3 carbon atoms. The alkylene group of $R^2$ may further have a substituent, and examples of the substituent include an aryl group and an alkoxy group.

Meanwhile, $R^2$ does not have a structure in which oxygen atoms and nitrogen atoms bonded to both ends of $R^2$ are bonded to the same carbon atom of $R^2$. $R^2$ is a linear or branched alkylene group connecting the oxygen atom to the nitrogen atom of the (meth)acrylamide group, and in the case where the alkylene group has a branched structure, it is also conceivable that $R^2$ has a —O—C—N— structure (hemiaminal structure) in which the oxygen atom and the nitrogen atom of the (meth)acrylamide group at both the ends are bonded to the same carbon atom in the alkylene group. However, a compound having such a structure is not encompassed by the compound represented by Formula (Y).

Examples of the divalent linking group of $R^3$ include an alkylene group, an arylene group, a heterocyclic group, and a group formed by combining these groups, among which an alkylene group is preferable. In the case where the divalent linking group contains an alkylene group, the alkylene group may further contain at least one group selected from —O—, —S—, and —NR$^b$—.

$R^b$ represents a hydrogen atom or an alkyl group having 1 to 4 carbon atoms.

x, y, and z each independently represent an integer of 0 to 6, preferably an integer of 0 to 5, and more preferably an integer of 0 to 3. x+y+z satisfies 0 to 18, preferably 0 to 15, and more preferably 0 to 9.

From the viewpoint of an excellent curing rate of the plated-layer precursor layer, a polyfunctional monomer represented by Formula (4) is more preferable.

The polyfunctional monomer represented by Formula (4) can be produced by, for example, the production method described in JP5486536B.

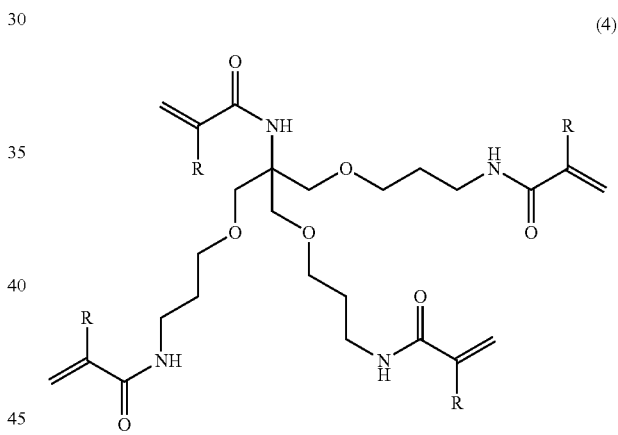

(4)

In Formula (4), R represents a hydrogen atom or a methyl group. In Formula (4), the plurality of R's may be the same as or different from each other.

The content of the polyfunctional monomer in the plated layer forming composition is not particularly limited, but from the viewpoint that it is possible to form a metal layer on a plated layer even in the case of forming the plated layer by exposure with a lower exposure amount, it is preferably 30% by mass or more, more preferably 40% by mass or more, and still more preferably 50% by mass or more, with respect to 100% by mass of the total solid content in the composition. The upper limit thereof is not particularly limited, but it is preferably 75% by mass or less and more preferably 70% by mass or less.

From the viewpoint that it is possible to form a metal layer on a plated layer even in the case of forming the plated layer by exposure with a lower exposure amount, the content of the polyfunctional monomer relative to the polymer having a group capable of interacting with a plating catalyst or a precursor thereof is preferably more than 1 and more preferably 2 or more in terms of mass ratio. The upper limit of the mass ratio is not particularly limited but it may be, for example, 20 or less.

<Polymerization Initiator>

The plated layer forming composition preferably contains a polymerization initiator. By including the polymerization initiator in the plated layer forming composition, the reaction between the polymerizable functional groups during the exposure treatment more efficiently proceeds.

The polymerization initiator is not particularly limited, and a known polymerization initiator (so-called photopolymerization initiator) or the like can be used. Examples of the polymerization initiator include benzophenones, acetophenones, α-aminoalkylphenones, benzoins, ketones, thioxanthones, benzyls, benzyl ketals, oxime esters, anthrones, tetramethylthiuram monosulfides, bisacylphosphine oxides, acylphosphine oxides, anthraquinones, azo compounds, and derivatives thereof.

The content of the polymerization initiator in the plated layer forming composition is not particularly limited, but from the viewpoint of the curability of the patterned plated layer, the content of the polymerization initiator is preferably 0.1% to 20% by mass and more preferably 1% to 10% by mass, with respect to the total content 100% by mass of the polyfunctional monomer.

<Solvent>

From the viewpoint of handleability, the plated layer forming composition preferably contains a solvent.

Examples of usable solvents include, but are not particularly limited to, water; an alcohol-based solvent such as methanol, ethanol, propanol, ethylene glycol, 1-methoxy-2-propanol, glycerin, or propylene glycol monomethyl ether; an acid such as acetic acid; a ketone-based solvent such as acetone, methyl ethyl ketone, or cyclohexanone; an amide-based solvent such as formamide, dimethylacetamide, or N-methylpyrrolidone; a nitrile-based solvent such as acetonitrile or propionitrile; an ester-based solvent such as methyl acetate or ethyl acetate; a carbonate-based solvent such as dimethyl carbonate or diethyl carbonate; an ether-based solvent, a glycol-based solvent, an amine-based solvent, a thiol-based solvent, and a halogen-based solvent.

Among them, an alcohol-based solvent, an amide-based solvent, a ketone-based solvent, a nitrile-based solvent, or a carbonate-based solvent is preferable.

The content of the solvent in the plated layer forming composition is not particularly limited, but it is preferably 50% to 98% by mass and more preferably 70% to 98% by mass, with respect to the total amount of the composition. In the case where the content of the solvent is within the above-specified range, handleability of the composition is excellent and therefore control of the layer thickness of the patterned plated layer is easy.

<Surfactant>

The plated layer forming composition preferably contains a surfactant. By including a surfactant in the plated layer forming composition, it is possible to suppress excessive sticking between the plated-layer precursor layer formed from the plated layer forming composition and the photo mask applied to the unexposed region of the plated-layer precursor layer at the time of exposure. That is, in the case where the photo mask is removed after exposure, adhesion of a part of the plated-layer precursor layer to the photo mask can also be suppressed, in addition to showing excellent removability of the photo mask.

As the surfactant, various surfactants such as a fluorine-based surfactant, a nonionic surfactant, a cationic surfactant, an anionic surfactant, and a silicone-based surfactant can be used. Among them, a fluorine-based surfactant or a silicone-based surfactant is preferable and a fluorine-based surfactant is more preferable from the viewpoint that the above-described effects are further exerted. The surfactants may be used alone or in combination of two or more thereof.

Examples of the fluorine-based surfactant include W-AHE and W-AHI (both of which are manufactured by FUJIFILM Corporation), MEGAFACE F171, F172, F173, F176, F177, F141, F142, F143, F144, R30, F437, F475, F479, F482, F554, F780, and F781F (all of which are manufactured by DIC Corporation), FLUORAD FC430, FC431, and FC171 (all of which are manufactured by Sumitomo 3M Limited), SURFLON S-382, SC-101, SC-103, SC-104, SC-105, SC1068, SC-381, SC-383, 5393, and KH-40 (all of which are manufactured by Asahi Glass Co., Ltd.), and PF636, PF656, PF6320, PF6520, and PF7002 (all of which are manufactured by OMNOVA Solutions Inc.).

The silicone-based surfactant that can be used may be a commercially available product, examples of which include Toray Silicone DC3PA, SH7PA, DC11PA, SH21PA, SH28PA, SH29PA, SH30PA, and SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP341, KF6001, and KF6002 (all of which are manufactured by Shin-Etsu Silicone Co., Ltd.), and BYK307, BYK323, and BYK330 (all of which are manufactured by BYK-Chemie GmbH).

The content of the surfactant in the plated layer forming composition is not particularly limited but it is preferably 0.01% to 1.5% by mass and more preferably 0.01% to 1% by mass with respect to the total amount of the composition.

<Other Additives>

The plated layer forming composition may contain other additives (for example, a sensitizer, a curing agent, a polymerization inhibitor, an antioxidant, an antistatic agent, an ultraviolet absorber, a filler, a particle, a flame retardant, a lubricant, and a plasticizer) as required.

[Film Having Plated-Layer Precursor Layer, Film Having Patterned Plated Layer, and Electroconductive Film]

Hereinafter, the electroconductive film of the present invention will be described in detail, and the film having a plated-layer precursor layer and the film having a patterned plated layer of the present invention will also be described in detail.

The electroconductive film of the present invention has a substrate, a patterned plated layer formed on the substrate, and a metal layer laminated on the surface of the patterned plated layer by means of a plating treatment.

The electroconductive film of the present invention can be produced by a production method having Steps 1 and 2 given below.

Step 1: a patterned plated layer forming step of forming a plated-layer precursor layer on a substrate using the plated layer forming composition, and then curing the plated-layer precursor layer in a patternwise manner by patternwise exposure to form a patterned plated layer Step 2: a metal layer forming step of forming a metal layer on the patterned plated layer by means of a plating treatment In the present specification, the film having a substrate and a plating precursor layer formed on the substrate is referred to as a "film having a plated-layer precursor layer", and the film obtained in Step 1 is referred to as a "film having a patterned plated layer".

FIG. 1 is a schematic cross-sectional view showing an example of an embodiment of an electroconductive film of the present invention. An electroconductive film 100 of FIG. 1 has a substrate 12, a patterned plated layer 20 disposed on the substrate 12, and a metal layer 22 disposed on the patterned plated layer 20.

Hereinafter, a method for producing the electroconductive film 100 will be described with reference to the accompanying drawings as an example. In addition, a method for producing a film having a plated-layer precursor layer of the present invention and a method for producing a film having a patterned plated layer of the present invention will also be described. The embodiments of the present invention are not limited to the aspect described below.

<Substrate>

The substrate is not particularly limited as long as it has two principal surfaces and supports a patterned plated layer to be described later. The substrate is preferably an insulating substrate, more specific examples of which include a resin substrate, a ceramic substrate, and a glass substrate.

Examples of the material of the resin substrate include a polyether sulfone-based resin, a poly(meth)acrylic resin, a polyurethane-based resin, a polyester-based resin (for example, polyethylene terephthalate or polyethylene naphthalate), a polycarbonate-based resin, a polysulfone-based resin, a polyamide-based resin, a polyarylate-based resin, a polyolefin-based resin, a cellulose-based resin, a polyvinyl chloride-based resin, and a cycloolefin-based resin. Among them, a polyester-based resin (for example, polyethylene terephthalate or polyethylene naphthalate) or a polyolefin-based resin is preferable.

The thickness (mm) of the substrate is not particularly limited, but it is preferably 0.01 to 2 mm and more preferably 0.02 to 0.1 mm from the viewpoint of the balance of handleability and thickness reduction.

Further, it is preferred that the substrate properly transmits light. Specifically, the total light transmittance of the substrate is preferably 85% to 100%.

Further, the substrate may have a multilayer structure. For example, a functional film may be included as one of the layers. Moreover, the substrate itself may be a functional film. Examples of the functional film include, but are not particularly limited to, a polarizing plate, a phase difference film, a cover plastic, a hard coat film, a barrier film, a pressure sensitive film, an electromagnetic wave shielding film, a heat generating film, an antenna film, and a wiring film for a device other than a touch panel.

Specific examples of the functional film used for a liquid crystal cell particularly associated with a touch panel include a polarizing plate such as NPF series (manufactured by Nitto Denko Corporation) or HLC2 series (manufactured by Sanritz Corporation); a phase difference film such as a WV film (manufactured by Fujifilm Corporation); a cover plastic such as FAINDE (manufactured by Dai Nippon Printing Co., Ltd.), TECHNOLLOY (manufactured by Sumitomo Chemical Co., Ltd.), IUPILON (manufactured by Mitsubishi Gas Chemical Company), SILPLUS (manufactured by Nippon Steel & Sumikin Chemical Co., Ltd.), ORGA (manufactured by Nippon Synthetic Chemical Industry Co., Ltd.), or SHORAYAL (manufactured by Showa Denko K.K.); and a hard coat film such as H series (manufactured by Lintec Corporation), FHC series (manufactured by Higashiyama Film Co., Ltd.), or a KB film (manufactured by Kimoto Co., Ltd.). These may form a patterned plated layer on the surface of each functional film.

Further, cellulose triacetate may be occasionally used for a polarizing plate or a phase difference film as described in JP2007-26426A, but from the viewpoint of resistance to a plating process, a cycloolefin (co)polymer can be used in place of cellulose triacetate. For example, ZEONOR (manufactured by Zeon Corporation) may be exemplified.

[Step 1: Patterned Plated Layer Forming Step]

Step 1 is a step of forming a patterned plated layer on a substrate through patternwise exposure of a coating film formed by a plated layer forming composition containing a polymer having a group capable of interacting with a plating catalyst or a precursor thereof, and a polyfunctional monomer having three or more (meth)acrylamide groups.

Figure 2A:
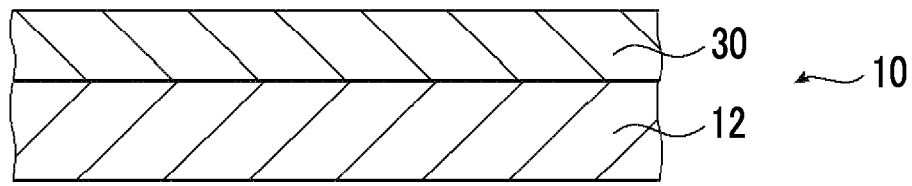
FIG. 2A is a cross-sectional view schematically showing an example of a step of obtaining a film 10 having a plated-layer precursor layer.
Figure 2B:
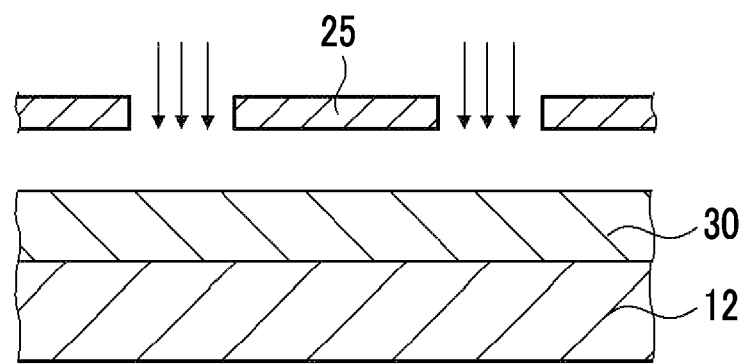
FIG. 2B is a cross-sectional view schematically showing an example of a step of curing a coating film 30 in a film 10 having a plated-layer precursor layer by exposure.
Figure 2C:
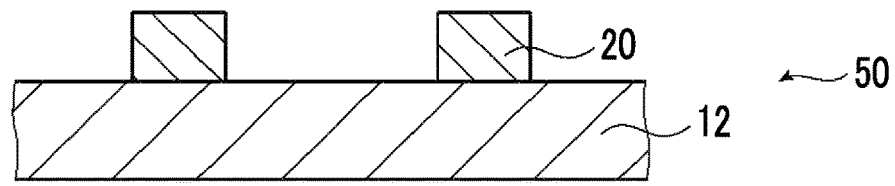
FIG. 2C is a cross-sectional view schematically showing an example of a step of obtaining a film 50 having a patterned plated layer.

More specifically, Step 1 is a step such that first, as shown in FIG. 2A, a coating film (corresponding to a plated-layer precursor layer) 30 of a plated layer forming composition is formed on a substrate 12 to produce a film having a plated-layer precursor layer 10, then, as shown in FIG. 2B, the coating film 30 is subjected to patternwise exposure as indicated by black arrows through a photo mask 25 to accelerate the reaction of the polymerizable functional group (for example, (meth)acrylamide group contained in a polyfunctional monomer having three or more (meth)acrylamide groups), so that the coating film 30 is cured, and thereafter the unexposed regions is removed to obtain a patterned plated layer 20 (FIG. 2C).

According to the function of the interactive group, the patterned plated layer 20 of the film 50 having a patterned plated layer formed by the above step adsorbs (adheres to) a plating catalyst or a precursor thereof in Step 2 to be described later. That is, the patterned plated layer functions as a good layer of receiving the plating catalyst or the precursor thereof. In addition, the polymerizable functional group is utilized for bonding of compounds through a curing treatment by exposure, and therefore a patterned plated layer having excellent hardness can be obtained.

In Step 1, a plated-layer precursor layer is first disposed on a substrate, but there is no particular limitation on the method of disposing the layer. For example, a method of bringing the plated layer forming composition into contact with the substrate to form a coating film of the plated layer forming composition may be mentioned. Such a method may be, for example, a method of applying the plated layer forming composition onto a substrate (coating method).

In the case of a coating method, the method of applying the plated layer forming composition onto the substrate is not particularly limited, and a known method (for example, a bar coating method, a spin coating method, a die coating method, or a dip coating method) may be used.

From the viewpoints of handleability and production efficiency, preferred is an aspect in which a coating film is formed by applying a plated layer forming composition onto a substrate and carrying out a drying treatment as necessary.

Although the conditions of the drying treatment are not particularly limited, it is preferable to carry out the drying treatment at room temperature to 220° C. (preferably 50° C. to 120° C.) for 1 to 30 minutes (preferably 1 to 10 minutes), from the viewpoint of superior productivity.

The method of exposing the coating film on the substrate in a patternwise manner is not particularly limited, and examples thereof include a method of irradiating actinic rays or radiation. As irradiation with actinic rays, a UV (ultraviolet) lamp or light irradiation by visible light or the like is used. Examples of the light source include a mercury lamp, a metal halide lamp, a xenon lamp, a chemical lamp, and a carbon arc lamp. Examples of the radiation include electron beams, X-rays, ion beams, and far infrared rays.

Specific aspects of exposing the coating film on the substrate in a patternwise manner suitably include scanning exposure by an infrared laser, high-illumination flash exposure such as a xenon discharge lamp exposure using a mask, and infrared lamp exposure using a mask. By exposing the coating film, the polymerizable functional group contained in the compound in the coating film is activated to result in crosslinking between the compounds, and the curing of the layer progresses.

The exposure time varies depending on the reactivity of the compound and the light source, but it is usually 10 to 300 seconds. The exposure energy (exposure amount) may be about 20 to 300 mJ/cm$^2$ and is preferably in the range of 50 to 100 mJ/cm$^2$.

Next, the unexposed region in the coating film is removed to form a patterned plated layer.

The removal method is not particularly limited, and an optimum method is appropriately selected according to the compound to be used. For example, a method in which an alkaline solution (preferably pH: 13.0 to 13.8) is used as a developer can be mentioned. In the case where an alkaline solution is used to remove an unexposed region, there are a method of immersing a substrate having an exposed coating film in a solution (immersion method), a method of applying a developer onto a substrate having an exposed coating film (coating method), and the like, among which the immersion method is preferable. In the case of the immersion method, the immersion time is preferably about 1 to 30 minutes from the viewpoints of productivity and workability.

Another method may be, for example, a method in which a solvent in which a compound to be used is dissolved is used as a developer and the substrate is immersed in the solvent.

<Patterned Plated Layer>

The thickness of the patterned plated layer formed by the above treatment is not particularly limited, but from the viewpoint of productivity, it is preferably 0.01 to 10 μm, more preferably 0.2 to 5 μm, and still more preferably 0.3 to 1.0 μm.

The pattern shape of the patterned plated layer is not particularly limited, and it is adjusted according to a place where a metal layer described later is desired to be formed. The pattern shape may be, for example, a mesh pattern. In the case of a mesh pattern, a length W of one side of a lattice (opening portion) in the mesh pattern is preferably 800 μm or less and more preferably 600 μm or less and is preferably 50 μm or more and more preferably 400 μm or more. The shape of the lattice is not particularly limited, and it may substantially be a diamond shape or a polygonal shape (for example, a triangular shape, a square shape, or a hexagonal shape). Further, the shape of one side may be a curved shape or an arc shape in addition to a linear shape.

The line width of the patterned plated layer is not particularly limited, but it is preferably 30 μm or less, more preferably 15 μm or less, still more preferably 10 μm or less, particularly preferably 9 μm or less, and most preferably 7 μm or less, from the viewpoint of low resistance of the metal layer disposed on the patterned plated layer. On the other hand, the lower limit thereof is preferably 0.5 μm or more and more preferably 1.0 μm or more.

[Step 2: Step of Forming Metal Layer]

Figure 2D:
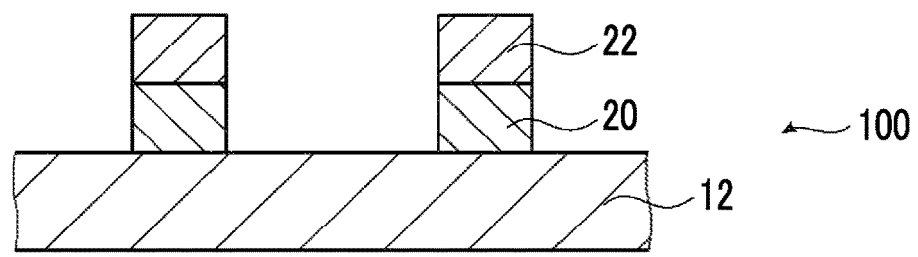
FIG. 2D is a cross-sectional view schematically showing an example of a step of forming a metal layer 22 on a patterned plated layer 20 to obtain an electroconductive film 100.

Step 2 is a step in which a plating catalyst or a precursor thereof is applied to the patterned plated layer formed in Step 1, and a plating treatment is carried out on the patterned plated layer to which a plating catalyst or a precursor thereof has been applied, so that a metal layer is formed on the patterned plated layer. As shown in FIG. 2D, by carrying out the present step, a metal layer 22 is disposed on a patterned plated layer 20, so an electroconductive film 100 is obtained.

Hereinafter, the step of applying a plating catalyst or a precursor thereof to the patterned plated layer (Step 2-1) and the step of carrying out a plating treatment on the patterned plated layer to which a plating catalyst or a precursor thereof has been applied (Step 2-2) will be described separately.

(Step 2-1: Catalyst Applying Step)

In the present step, first, a plating catalyst or a precursor thereof is applied to a patterned plated layer. The above-mentioned interactive group derived from a polymer having a group capable of interacting with a plating catalyst or a precursor thereof adheres to (adsorbs) the applied plating catalyst or precursor thereof, according to the function thereof. More specifically, the plating catalyst or the precursor thereof is applied in the patterned plated layer and on the surface of the patterned plated layer.

The plating catalyst or the precursor thereof functions as a catalyst or electrode of a plating treatment. Therefore, the type of the plating catalyst or the precursor thereof to be used is appropriately determined in accordance with the type of the plating treatment.

Further, the plating catalyst or the precursor thereof to be used is preferably an electroless plating catalyst or a precursor thereof.

Any plating catalyst may be used as the plating catalyst used in the present step as long as it serves as an active nucleus during plating. Specifically, a metal having a catalytic capacity of the autocatalytic reduction reaction (which is known as a metal capable of electroless plating with lower ionization tendency than Ni) may be used. Specific examples thereof include Pd, Ag, Cu, Ni, Pt, Au, and Co. Among them, particularly preferred is Ag, Pd, Pt, or Cu from the viewpoint of high catalytic capacity.

A metallic colloid may be used as the plating catalyst.

The plating catalyst precursor in the present step can be used without any particular limitation as long as it may be converted into the plating catalyst by a chemical reaction. Metal ions of the metals illustrated above for the plating catalyst are mainly used. The metal ions which are the plating catalyst precursors are converted by the reduction reaction into zero-valent metals which are the plating catalysts. After the metal ion as the plating catalyst precursor is applied to the patterned plated layer, the electroless plating catalyst precursor may be separately converted into a zero-valent metal as the plating catalyst by the reduction reaction before being immersed in a plating bath. Alternatively, the plating catalyst precursor may be immersed into the plating bath without any treatment to be converted into a metal (plating catalyst) by the action of a reducing agent in the plating bath.

The metal ion is preferably applied to the patterned plated layer using a metal salt. The metal salt to be used is not particularly limited as long as it is dissolved in an appropriate solvent and dissociated into a metal ion and a base (anion), and example thereof include $M(NO_3)_n$, $MCl_n$, $M_{2/n}(SO_4)$, and $M_{3/n}(PO_4)$ (M represents an n-valent metal atom). As metal ions, those metal ions dissociated from the foregoing metal salts can be suitably used. Specific examples thereof include Ag ions, Cu ions, Al ions, Ni ions, Co ions, Fe ions, and Pd ions, among which those capable of being coordinated at multiple sites are preferable and, in particular, Ag ions or Pd ions are preferable from the viewpoints of the number of types of functional groups capable of being coordinated and the catalytic capacity.

As a method for applying a metal ion to the patterned plated layer, for example, a solution containing a dissociated metal ion may be prepared by dissolving a metal salt in an appropriate solvent, and then the solution may be applied onto the patterned plated layer, or alternatively, a substrate on which the patterned plated layer is formed may be immersed in the solution.

Water or an organic solvent is appropriately used as the solvent. The organic solvent is preferably a solvent capable of permeating the patterned plated layer. For example, acetone, methyl acetoacetate, ethyl acetoacetate, ethylene glycol diacetate, cyclohexanone, acetylacetone, acetophenone, 2-(1-cyclohexenyl)cyclohexanone, propylene glycol diacetate, triacetin, diethylene glycol diacetate, dioxane, N-methylpyrrolidone, dimethyl carbonate, or dimethyl cellosolve may be used.

The concentration of the plating catalyst or the precursor thereof in the solution is not particularly limited, but it is preferably 0.001% to 50% by mass and more preferably 0.005% to 30% by mass.

The contact time is preferably about 30 seconds to 24 hours and more preferably about 1 minute to 1 hour.

The adsorbed amount of the plating catalyst or the precursor thereof of the patterned plated layer varies depending on a plating bath species to be used, a catalyst metal species, an interactive group species of a patterned plated layer, usage and the like, but it is preferably 5 to 1,000 mg/m$^2$, more preferably 10 to 800 mg/m$^2$, and still more preferably 20 to 600 mg/m$^2$ from the viewpoint of a deposition property of plating.

(Step 2-2: Plating Treatment Step)

Next, a plating treatment is carried out on the patterned plated layer to which a plating catalyst or a precursor thereof has been applied.

The method of a plating treatment is not particularly limited, and examples thereof include an electroless plating treatment and an electrolytic plating treatment (electroplating treatment). In the present step, an electroless plating treatment may be carried out alone, or an electrolytic plating treatment may be further carried out following an electroless plating treatment.

In the present specification, a so-called silver mirror reaction is included as one type of the above-mentioned electroless plating treatment. Thus, a desired patterned metal layer may be formed by reducing the adhered metal ions, for example, by a silver mirror reaction or the like, and thereafter an electrolytic plating treatment may be further carried out.

Hereinafter, the procedure of the electroless plating treatment and electrolytic plating treatment will be described in detail.

The electroless plating treatment refers to an operation of allowing metals to be deposited through a chemical reaction using a solution in which metal ions expected to be deposited as plating are dissolved.

The electroless plating treatment in the present step is carried out by washing the substrate including the patterned plated layer to which metal ions have been applied with water to remove extra metal ions, and then immersing the substrate in an electroless plating bath. A known electroless plating bath can be used as the electroless plating bath to be used. In addition, metal ions are reduced and then electroless plating is carried out in the electroless plating bath.

Separately from the aspect of using the above-mentioned electroless plating liquid, the reduction of metal ions in the patterned plated layer can be performed by preparing a catalyst activating liquid (reducing liquid) as a separate step before the electroless plating treatment. The catalyst activating liquid is a liquid in which a reducing agent capable of reducing a metal ion into a zero-valent metal is dissolved, and the concentration of the reducing agent with respect to the entire liquid is preferably 0.1% to 50% by mass and more preferably 1% to 30% by mass. As the reducing agent, a boron-based reducing agent such as sodium borohydride or dimethylamine borane, or a reducing agent such as formaldehyde or hypophosphorous acid can be used.

During the immersion, it is preferred that the substrate is immersed while stirring or shaking.

Typically, the composition of the electroless plating bath mainly includes 1. metal ions for plating, 2. reducing agent, and 3. additive (stabilizer) that improves the stability of metal ions in addition to a solvent (for example, water). In addition to these, the plating bath may include a known additive such as a stabilizer for a plating bath.

The organic solvent used for the electroless plating bath is required to be a solvent which is soluble in water. From this viewpoint, ketones such as acetone; and alcohols such as methanol, ethanol, and isopropanol are preferable. As the type of metal used for the electroless plating bath, copper, tin, lead, nickel, gold, silver, palladium, or rhodium is known. Among them, from the viewpoint of conductivity, copper, silver, or gold is preferable and copper is more preferable. Further, an optimal reducing agent and an optimal additive are selected according to the metal.

The immersion time in the electroless plating bath is preferably 1 minute to 6 hours and more preferably 1 minute to 3 hours.

The electrolytic plating treatment refers to an operation of allowing metals to be deposited by an electric current using a solution in which metal ions expected to be deposited as plating are dissolved.

Further, in the present step as described above, the electrolytic plating treatment may be carried out as necessary, after the electroless plating treatment. According to such an aspect, the thickness of the patterned metal layer to be formed can be suitably adjusted.

As the method of electrolytic plating, a conventional known method can be used. Further, examples of metals used for electrolytic plating include copper, chromium, lead, nickel, gold, silver, tin, and zinc. Among them, from the viewpoint of conductivity, copper, gold, or silver is preferable and copper is more preferable.

In addition, the film thickness of the metal layer obtained by the electrolytic plating can be controlled by adjusting the concentration of a metal contained in the plating bath or the current density.

The thickness of the metal layer to be formed by the above-mentioned procedures is not particularly limited and the optimal thickness can be suitably selected according to the intended use, but it is preferably 0.1 µm or greater, more preferably 0.5 µm or greater, and still more preferably 1 to 30 µm, from the viewpoint of conductive properties.

Moreover, the type of metal constituting the metal layer is not particularly limited and examples thereof include copper, chromium, lead, nickel, gold, silver, tin, and zinc. Among them, from the viewpoint of conductivity, copper, gold, or silver is preferable and copper or silver is more preferable.

The pattern shape of the metal layer is not particularly limited, but the metal layer may have, for example, a mesh pattern because the metal layer is disposed on the patterned plated layer, so that the shape thereof is adjusted by the pattern shape of the patterned plated layer. The metal layer having a mesh pattern can be suitably applied as a sensor electrode in a touch panel. In the case where the pattern shape of the metal layer is a mesh pattern, the range of the length W of one side of the lattice (opening portion) in the mesh pattern, the suitable aspect of the lattice shape, and the line width of the metal layer are the same as in the above-mentioned aspect of a patterned plated layer.

(Interlayer)

Figure 3:
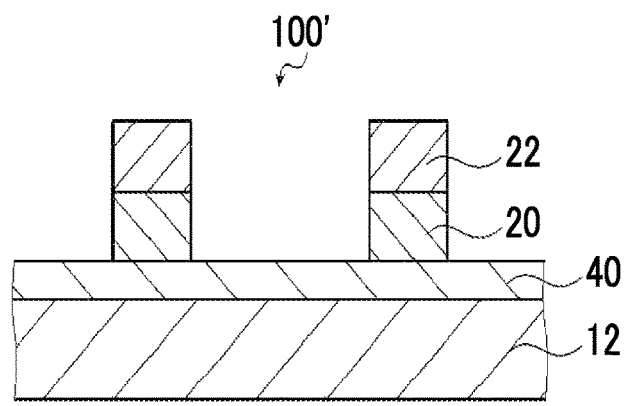
FIG. 3 is a cross-sectional view schematically showing another example of the embodiment of the electroconductive film of the present invention.

As another example of the embodiment of the electroconductive film, an interlayer may be further included on the substrate. More specifically, as shown in an electroconductive film 100' of FIG. 3, an interlayer 40 may be further disposed adjacent to the substrate 12. Disposing the interlayer between the substrate and the patterned plated layer further improves the adhesiveness therebetween.

The thickness of the interlayer is not particularly limited, but it is generally preferably 0.01 to 100 μm, more preferably 0.05 to 20 μm, and still more preferably 0.05 to 10 μm.

The material for the interlayer is not particularly limited, and is preferably a resin having good adhesiveness to the substrate. As a specific example of the resin, for example, a thermosetting resin, a thermoplastic resin, or a mixture thereof may be used. Examples of the thermosetting resin include an epoxy resin, a phenol resin, a polyimide resin, a polyester resin, a bismaleimide resin, a polyolefin-based resin, and an isocyanate-based resin. Examples of the thermoplastic resin include a phenoxy resin, polyethersulfone, polysulfone, polyphenylene sulfone, polyphenylene sulfide, polyphenyl ether, polyether imide, and an acrylonitrile-butadiene-styrene copolymer (ABS) resin.

The thermoplastic resin and the thermosetting resin may be respectively used alone or in combination of two or more thereof. Further, a resin containing a cyano group may be used. Specifically, an ABS resin, or the "polymer containing a unit having a cyano group in the side chain thereof" described in paragraphs [0039] to [0063] of JP2010-84196A may be used.

Further, rubber components such as NBR rubber (acrylonitrile butadiene rubber) or SBR rubber (styrene butadiene rubber) may also be used.

One suitable aspect of the material constituting the interlayer may be, for example, a polymer having a conjugated diene compound unit which may be hydrogenated. The conjugated diene compound unit refers to a repeating unit derived from a conjugated diene compound. The conjugated diene compound is not particularly limited as long as it is a compound having a molecular structure having two carbon-carbon double bonds separated by one single bond.

One suitable aspect of the repeating unit derived from the conjugated diene compound may be, for example, a repeating unit generated by a polymerization reaction of a compound having a butadiene skeleton.

The conjugated diene compound unit may be hydrogenated, and in the case of containing a hydrogenated conjugated diene compound unit, adhesiveness of the metal layer is further improved, which is thus preferable. That is, the double bond in the repeating unit derived from the conjugated diene compound may be hydrogenated.

The polymer having a conjugated diene compound unit which may be hydrogenated may contain the above-mentioned interactive group.

Examples of very suitable aspects of this polymer include an acrylonitrile butadiene rubber (NBR), a carboxy group-containing nitrile rubber (XNBR), an acrylonitrile-butadiene-isoprene rubber (NBIR), an acrylonitrile-butadiene-styrene copolymer (ABS resin), and a hydrogenated product thereof (for example, a hydrogenated acrylonitrile butadiene rubber (also known as hydrogenated nitrile rubber (HNBR))).

The interlayer may contain other additives such as a sensitizer, an antioxidant, an antistatic agent, an ultraviolet absorber, a filler, a particle, a flame retardant, a surfactant, a lubricant, and a plasticizer.

The method of forming the interlayer is not particularly limited and may be, for example, a method of laminating a resin to be used on a substrate, or a method of dissolving necessary components in a solvent capable of dissolving them and applying the solution onto the substrate surface by a coating method or the like, followed by drying.

The conditions for the heating temperature and time in the coating method may be selected such that the coating solvent can be sufficiently dried, but from the viewpoint of production suitability, it is preferred that the heating conditions are a heating temperature of 200° C. or lower and a heating time of within 60 minutes and it is more preferred that the heating conditions are a heating temperature of 40° C. to 100° C. and a heating time of within 20 minutes. As the solvent to be used, an optimum solvent (for example, cyclohexanone or methyl ethyl ketone) is appropriately selected according to the resin to be used.

In the case of using the substrate on which the interlayer is disposed, a desired electroconductive film can be obtained by carrying out Step 1 and Step 2 above the interlayer.

[Applications]

The electroconductive film having a metal layer obtained by the foregoing treatment can be applied to various uses and can be applied to various applications such as a touch panel (or a touch panel sensor), a semiconductor chip, various electric wiring boards, a flexible printed circuit (FPC), a chip on film (COF), a tape automated bonding (TAB), an antenna, a multilayer wiring board, and a mother board. Among them, it is preferable to use such an electroconductive film for a touch panel sensor (electrostatic capacitance touch panel sensor). In the case where the electroconductive laminate is applied to a touch panel sensor, the metal layer in the electroconductive film functions as a detection electrode or a lead-out wiring in the touch panel sensor.

In the present specification, a combination of a touch panel sensor and various display devices (for example, a liquid crystal display device and an organic electroluminescence (EL) display device) is called a touch panel. The touch panel is preferably, for example, a so-called electrostatic capacitance touch panel.

EXAMPLES

Hereinafter, the present invention will be described in more detail with reference to Examples. The materials, the use amounts, the ratios, the treatment contents, the treatment procedures, and the like shown in the following Examples can be appropriately changed without departing from the gist of the present invention. Therefore, the scope of the present invention should not be limitatively interpreted by the following Examples.

In the following Examples, "%" and "part" are on the basis of mass.

Example 1

(Preparation of Plated Layer Forming Composition)

Polyacrylic acid (having a viscosity of 8,000 to 12,000 cp (1 cp=1 mPa·s), weight-average molecular weight of 370,000, manufactured by Wako Pure Chemical Industries, Ltd.) as a polymer and tetrafunctional acrylamide A having the following structure (where R in the structural formula is hydrogen) as a polyfunctional monomer were added at a solid content mass ratio of 3:7 in isopropanol to prepare a solution, and then an oxime-based polymerization initiator (Irgacure OXE 02, manufactured by BASF Japan Ltd.) was added to the solution so that the content thereof was 5% by mass with respect to the polyfunctional monomer. Next, W-AHE (manufactured by FUJIFILM Corporation) as a surfactant was added to the solution to which the oxime-based polymerization initiator had been added so that the concentration thereof was 0.02% by mass with respect to the total mass of the composition, thereby preparing a plated layer forming composition of Example 1. Incidentally, the content of isopropanol in the plated layer forming composition was 90% by mass.

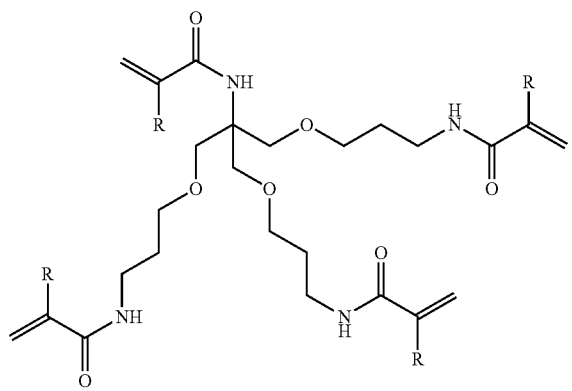

<Evaluation of Lowest Exposure Amount at which Plating is Deposited>

Using the plated layer forming composition of Example 1, the lowest exposure amount at which plating is deposited was evaluated by the following method.

The plated layer forming composition of Example 1 was applied onto a polyester film (A4300, manufactured by Toyobo Co., Ltd.) having a thickness of 50 μm with a bar coater, and then the polyester film coated with the plated layer forming composition was dried at 80° C. for 3 minutes to form a coating film having a thickness of about 0.5 μm on the polyester film.

The obtained coating film was subjected to exposure by irradiating light having a wavelength of 365 nm using a parallel exposure machine so as to obtain a step wedge-like image shape by changing the exposure amount. Next, the film subjected to the exposure treatment was developed with an aqueous 1% by mass sodium carbonate solution.

Thereafter, the developed film was washed with water, and the polyester film having the film washed with water was immersed in a Pd catalyst-providing liquid (manufactured by R&H Co., Ltd.) at 30° C. for 5 minutes. Next, the polyester film taken out from the Pd catalyst-providing liquid was washed with water, and then the polyester film was immersed in a metal catalyst reducing liquid (manufactured by R&H Co., Ltd.) at 30° C. Next, the polyester film taken out from the metal catalyst reducing liquid was washed again with water, and then the polyester film was immersed in a copper plating liquid (manufactured by R&H Co., Ltd.) at 30° C. for 15 minutes.

The copper plating liquid (manufactured by R&H Co., Ltd.) was an alkaline plating liquid.

By visual observation of the film obtained through the above method, the lowest exposure amount at which plating starts to deposit was evaluated. A smaller numerical value means that the metal layer can be formed with a lower exposure amount. The results are shown in Table 1.

In Comparative Example 3, no metal layer was deposited.

(Formation of Metal Layer (Metal Wiring))

Using the plated layer forming composition of Example 1, an electroconductive film in which a patterned plated layer and a metal layer (metal wiring) on the surface thereof were laminated on a substrate was produced by the following procedure.

First, the plated layer forming composition of Example 1 was applied onto a polyester film (A4300, manufactured by Toyobo Co., Ltd.) having a thickness of 50 μm with a bar coater, and then the polyester film coated with the plated layer forming composition was dried at 80° C. for 3 minutes to form a plated layer precursor layer (thickness: about 0.5 μm). The obtained plated-layer precursor layer was irradiated with light having a wavelength of 365 nm by using a parallel exposure machine through a photo mask so as to obtain an exposure amount in the evaluation of the lowest exposure amount at which the plating is deposited.

Subsequently, the plated-layer precursor layer after the exposure was developed with an aqueous 1% by mass sodium carbonate solution to obtain a patterned plated layer. Thereafter, the polyester film having the patterned plated layer was washed with water, and then the polyester film was immersed in a Pd catalyst-providing liquid (manufactured by R&H Co., Ltd.) at 30° C. for 5 minutes. Next, the polyester film taken out from the Pd catalyst-providing liquid was washed with water, and then the polyester film was immersed in a metal catalyst reducing liquid (manufactured by R&H Co., Ltd.) at 30° C. Next, the polyester film taken out from the metal catalyst reducing liquid was washed again with water, and then the polyester film was immersed in a copper plating liquid (manufactured by R&H Co., Ltd.) at 30° C. for 15 minutes.

The copper plating liquid (manufactured by R&H Co., Ltd.) was an alkaline plating liquid as described above.

<Evaluation of Alkali Resistance>

By visual observation of the obtained metal wiring, the alkali resistance of the patterned plated layer was evaluated. Evaluation standards are as follows.

"A": The entire pattern was covered with copper plating.

"B": Although the coverage by copper plating was not the entire pattern area, it exceeded 50 area % of the entire pattern.

"C": The coverage by copper plating was 50 area % or less of the entire pattern.

The results are shown in Table 1.

<Evaluation of Sticking Properties>

In the formation of the metal wiring, the sticking properties between the plated-layer precursor layer and the photo mask were evaluated after completion of the exposure. Specifically, the sticking properties were evaluated by peeling the sample film from the photo mask after completion of the exposure and visually observing the photo mask after peeling off the sample film. Evaluation standards are as follows.

"A": There was no transfer of constituent components of plated-layer precursor layer to photo mask "B": There was transfer of constituent components of plated-layer precursor layer to photo mask The results are shown in Table 1.

Example 2

A plated layer forming composition was obtained in the same manner as in Example 1, except that the solid content mass ratio of the polymer and the polyfunctional monomer was 4:6.

The lowest exposure amount, alkali resistance, and sticking properties of the obtained plated layer forming composition were evaluated in the same manner as in Example 1. The results are shown in Table 1.

Example 3

A plated layer forming composition was obtained in the same manner as in Example 1, except that the solid content mass ratio of the polymer and the polyfunctional monomer was 5:5.

The lowest exposure amount, alkali resistance, and sticking properties of the obtained plated layer forming composition were evaluated in the same manner as in Example 1. The results are shown in Table 1.

Example 4

A plated layer forming composition was obtained in the same manner as in Example 1, except that the solid content ratio of the polymer and the polyfunctional monomer was 6:4.

The lowest exposure amount, alkali resistance, and sticking properties of the obtained plated layer forming composition were evaluated in the same manner as in Example 1. The results are shown in Table 1.

Example 5

A plated layer forming composition was obtained in the same manner as in Example 1, except that no surfactant was added.

The lowest exposure amount, alkali resistance, and sticking properties of the obtained plated layer forming composition were evaluated in the same manner as in Example 1. The results are shown in Table 1.

Example 6

A plated layer forming composition was obtained in the same manner as in Example 1, except that the polymer was polyphosphoric acid (manufactured by PCAS Company).

The lowest exposure amount, alkali resistance, and sticking properties of the obtained plated layer forming composition were evaluated in the same manner as in Example 1. The results are shown in Table 1.

Comparative Example 1

A plated layer forming composition was obtained in the same manner as in Example 1, except that the polyfunctional monomer was N-isopropylacrylamide (manufactured by Wako Pure Chemical Industries, Ltd.).

The lowest exposure amount, alkali resistance, and sticking properties of the obtained plated layer forming composition were evaluated in the same manner as in Example 1. The results are shown in Table 1.

Comparative Example 2

A plated layer forming composition was obtained in the same manner as in Example 1, except that the polyfunctional monomer was 1,4-diacryloylpiperazine (manufactured by Wako Pure Chemical Industries, Ltd.).

The lowest exposure amount, alkali resistance, and sticking properties of the obtained plated layer forming composition were evaluated in the same manner as in Example 1. The results are shown in Table 1.

Comparative Example 3

A plated layer forming composition was obtained in the same manner as in Example 1, except that the polyfunctional monomer was dipentaerythritol hexaacrylate (DPHA, manufactured by Sigma-Aldrich Co. LLC).

The lowest exposure amount, alkali resistance, and sticking properties of the obtained plated layer forming composition were evaluated in the same manner as in Example 1. The results are shown in Table 1.

TABLE 1

| | Plated layer forming composition | | | | | Evaluation | | |
|---|---|---|---|---|---|---|---|---|
| | Polymer | Polyfunctional monomer or monofunctional monomer | Initiator | Surfactant | Polymer/ polyfunctional monomer or monofunctional monomer (mass ratio) | Lowest exposure amount at which plating is deposited [mJ/cm$^2$] | Alkali resistance | Sticking resistance |
| Example 1 | Polyacrylic acid | Tetrafunctional acrylamide A | 5% by mass with respect to polyfunctional monomer | 0.02% by mass with respect to total mass of composition | 3/7 | 55 | A | A |
| Example 2 | Polyacrylic acid | Tetrafunctional acrylamide A | 5% by mass with respect to polyfunctional monomer | 0.02% by mass with respect to total mass of composition | 4/6 | 94 | A | A |
| Example 3 | Polyacrylic acid | Tetrafunctional acrylamide A | 5% by mass with respect to polyfunctional monomer | 0.02% by mass with respect to total mass of composition | 5/5 | 126 | A | A |
| Example 4 | Polyacrylic acid | Tetrafunctional acrylamide A | 5% by mass with respect to polyfunctional monomer | 0.02% by mass with respect to total mass of composition | 6/4 | 162 | A | A |
| Example 5 | Polyacrylic acid | Tetrafunctional acrylamide A | 5% by mass with respect to polyfunctional monomer | Not added | 3/7 | 60 | A | B |

TABLE 1-continued

| | Plated layer forming composition | | | | | Evaluation | | |
|---|---|---|---|---|---|---|---|---|
| | Polymer | Polyfunctional monomer or monofunctional monomer | Initiator | Surfactant | Polymer/ polyfunctional monomer or monofunctional monomer (mass ratio) | Lowest exposure amount at which plating is deposited [mJ/cm$^2$] | Alkali resistance | Sticking resistance |
| Example 6 | Polyphosphoric acid | Tetrafunctional acrylamide A | 5% by mass with respect to polyfunctional monomer | 0.02% by mass with respect to total mass of composition | 3/7 | 58 | A | A |
| Comparative Example 1 | Polyacrylic acid | Monofunctional acrylamide (N-isopropylacrylamide) | 5% by mass with respect to monofunctional monomer | 0.02% by mass with respect to total mass of composition | 3/7 | 600 | A | A |
| Comparative Example 2 | Polyacrylic acid | Difunctional acrylamide (1,4-diacryloylpiperazine) | 5% by mass with respect to polyfunctional monomer | 0.02% by mass with respect to total mass of composition | 3/7 | 220 | A | A |
| Comparative Example 3 | Polyacrylic acid | Polyfunctional acrylate (DPHA) | 5% by mass with respect to polyfunctional monomer | 0.02% by mass with respect to total mass of composition | 3/7 | — | C | A |

It was confirmed that, in the case of using each of the plated layer forming compositions of Examples, it is possible to form a plated layer having excellent alkali resistance and it is also possible to form a metal layer on the plated layer even in the case of forming the plated layer by exposure with a low exposure amount.

From the comparison with Examples 1 to 4, it was confirmed that, by setting the content of the polyfunctional monomer relative to the polymer to be more than 1 (preferably 2 or more) in terms of mass ratio, the lowest exposure amount at which plating is deposited becomes lower.

Further, from the comparison between Example 1 and Example 6, it was confirmed that, in the case where the polymer has a carboxy group, the lowest exposure amount at which plating is deposited becomes lower.

Further, from the comparison between Example 5 and Example 1, it is confirmed that, in the case where the plated layer forming composition contains a surfactant, sticking of the photo mask after exposure can be reduced, in other words, sticking properties can be improved.

On the other hand, the plated layer forming compositions of Comparative Examples did not satisfy the desired performance.

<Tape Adhesiveness Evaluation (Tape Peeling Test)>

Further, according to the following method, tape adhesiveness evaluation (tape peeling test) was carried out on the metal layers (metal wirings) produced as described above using the plated layer forming composition of Example 1.

In addition, similarly to Example 1, tape adhesiveness evaluation (tape peeling test) was also carried out on the metal layers (metal wirings) produced as described above using the plated layer forming compositions of Examples 2 to 6 and Comparative Examples 1 to 3. The results are shown in Table 2.

(Evaluation Method and Standards)

A pressure sensitive tape (trade name: CELLOTAPE (registered trademark), manufactured by Nichiban Co., Ltd.) was affixed to the area where the metal pattern was formed on the substrate and then immediately peeled off. The presence or absence of transfer of the metal layer to the peeled tape was visually observed and the adhesiveness of the metal layer was evaluated according to the following evaluation standards. The results are shown in Table 2.

"A": Transfer of metal layer to tape was not observed

"B": Transfer of metal layer to tape was observed

In addition, as shown below, the electroconductive films of Examples 7 and 8 having an interlayer between the substrate and the patterned plated layer were produced, and the above-mentioned tape adhesiveness evaluation was carried out by the same method. The results are shown in Table 2.

Example 7

A liquid obtained by dissolving 100 g of hydrogenated acrylonitrile butadiene rubber Zetpol 0020 (manufactured by Zeon Corporation) in 900 g of cyclopentanone (manufactured by Tokyo Chemical Industry Co., Ltd.) was used as an interlayer forming composition. Subsequently, the interlayer forming composition was applied onto a polyester film (A4300, manufactured by Toyobo Co., Ltd.) having a thickness of 50 μm so as to have a film thickness of 2 μm, and then the polyester film coated with the interlayer forming composition was dried to form a coating film of the interlayer.

Further, according to the same procedure as in Example 1, a plated-layer precursor layer having a film thickness of 0.5 μm was provided on the above-produced interlayer using the plated layer forming composition of Example 1, and thereafter an electroconductive film in which a patterned plated layer and a metal layer (metal wiring) on the surface thereof were laminated was produced.

Using the obtained electroconductive film, the above-mentioned tape adhesiveness evaluation was carried out. The results are shown in Table 2.

Example 8

An electroconductive film of Example 8 was produced in the same manner as in Example 7, except that the plated layer forming composition of Example 2 was used in place of the plated layer forming composition of Example 1, and the above-mentioned tape adhesiveness evaluation was carried out. The results are shown in Table 2.

TABLE 2

| | Tape adhesiveness evaluation |
|---|---|
| Example 1 | B |
| Example 2 | B |
| Example 3 | B |
| Example 4 | B |
| Example 5 | B |
| Example 6 | B |
| Example 7 | A |
| Example 8 | A |
| Comparative Example 1 | B |
| Comparative Example 2 | B |
| Comparative Example 3 | B |

As shown in Table 2, it was confirmed that, by providing an interlayer between the substrate and the patterned plated layer as in Examples 7 and 8, adhesiveness of the metal layer to the substrate can be further improved.

EXPLANATION OF REFERENCES

10: film having a plated-layer precursor layer
50: film having a patterned plated layer
12: substrate
20: patterned plated layer
22: metal layer
25: photo mask
30: coating film (plated-layer precursor layer)
40: interlayer
100, 100': electroconductive film

What is claimed is:

1. A film having a cured plated-layer precursor layer, comprising:
    an insulating substrate; and
    a cured plated-layer precursor layer disposed on the substrate,
    wherein the cured plated-layer precursor layer is formed by curing a plated layer forming composition by exposure,
    wherein the plated layer forming composition includes:
        a polymer having a group capable of interacting with a plating catalyst, and
        a polyfunctional monomer having three or more acrylamide groups or methacrylamide groups,
    wherein when the composition is cured by exposure, the polyfunctional monomer is crosslinked to form a network, and the polymer is entangled and retained in the network, and
    wherein in the cured plated-layer precursor layer, the plating catalyst is adsorbed to the polymer.

2. The film according to claim 1, further comprising:
    an interlayer between the insulating substrate and the cured plated-layer precursor layer.

3. The film according to claim 1, wherein the group capable of interacting with a plating catalyst is a carboxy group.

4. The film according to claim 1, wherein a content of the polyfunctional monomer relative to the polymer is more than 1 in terms of mass ratio.

5. The film according to claim 1, wherein the polyfunctional monomer has from 3 to 8 acrylamide groups or methacrylamide groups.

6. The film according to claim 1, wherein the composition further comprising a surfactant.

7. The film according to claim 1, wherein the insulating substrate is a resin substrate, a ceramic substrate, or a glass substrate.

* * * * *